United States Patent
Park et al.

(10) Patent No.: US 9,312,814 B2
(45) Date of Patent: Apr. 12, 2016

(54) DEMODULATION DEVICE, AND DEMODULATION INTEGRATED DEVICE AND MODULATION AND DEMODULATION INTEGRATED DEVICE USING THE SAME

(71) Applicant: Korea Basic Science Institute, Daejeon (KR)

(72) Inventors: Seung Young Park, Daejeon (KR); Sang IL Kim, Busan (KR)

(73) Assignee: KOREA BASIC SCIENCE INSTITUTE, Daejeon (KR)

( * ) Notice: Subject to any disclaimer, the term of this patent is extended or adjusted under 35 U.S.C. 154(b) by 0 days.

(21) Appl. No.: 13/980,861

(22) PCT Filed: Dec. 7, 2012

(86) PCT No.: PCT/KR2012/010649
§ 371 (c)(1),
(2) Date: Dec. 23, 2014

(87) PCT Pub. No.: WO2013/147390
PCT Pub. Date: Oct. 3, 2013

(65) Prior Publication Data
US 2015/0318823 A1    Nov. 5, 2015

(30) Foreign Application Priority Data

Mar. 28, 2012 (KR) .................. 10-2012-0031427
Nov. 22, 2012 (KR) .................. 10-2012-0133050

(51) Int. Cl.
H03D 1/00 (2006.01)
H03D 3/28 (2006.01)
H03C 1/00 (2006.01)
(Continued)

(52) U.S. Cl.
CPC .................. *H03D 3/28* (2013.01); *G01R 33/06* (2013.01); *G01R 33/09* (2013.01); *G11B 5/02* (2013.01); *H01L 29/82* (2013.01); *H03B 15/006* (2013.01); *H03C 1/00* (2013.01); *H03C 3/02* (2013.01); *H03D 1/00* (2013.01); *H03D 1/2236* (2013.01);
(Continued)

(58) Field of Classification Search
CPC .......... G11B 5/02; G01R 33/06; G01R 33/09; H01L 29/82; H04B 1/38; H04L 27/06; H03D 5/00; H03D 1/2236
USPC ....... 360/55; 365/171; 331/154, 96; 428/811, 428/820.2; 329/347, 348
See application file for complete search history.

(56) References Cited

U.S. PATENT DOCUMENTS 8,049,567 B2 * 11/2011 Persson ................ H03B 15/006
257/421
2013/0148229 A1 * 6/2013 Braganca .................. G11B 5/02
360/55

FOREIGN PATENT DOCUMENTS

KR    10-1999-0077650 A    10/1999
KR    10-2002-0085877 A    11/2002
(Continued)

*Primary Examiner* — Arnold Kinkead

(57) ABSTRACT

A demodulation device according to the present invention includes a spin device configured to output an oscillation signal; a phase control unit configured to assign a predetermined phase locking characteristic to the spin device, thereby causing the oscillation signal to be tuned to a modulation signal that is input to the spin device; and a detector configured to demodulate the oscillation signal that is output by the spin device and tuned to the modulation signal, thereby restoring information carried on the oscillation signal.

18 Claims, 19 Drawing Sheets

(51) Int. Cl.
*H03C 3/02* (2006.01)
*H03B 15/00* (2006.01)
*G01R 33/06* (2006.01)
*H01L 29/82* (2006.01)
*G01R 33/09* (2006.01)
*H04B 1/38* (2015.01)
*H03D 5/00* (2006.01)
*H03D 1/22* (2006.01)
*G11B 5/02* (2006.01)
*H04L 27/14* (2006.01)
*H04L 27/06* (2006.01)

(52) U.S. Cl.
CPC .. *H03D 5/00* (2013.01); *H04B 1/38* (2013.01); *H04L 27/14* (2013.01); *H04L 27/06* (2013.01)

(56) References Cited

FOREIGN PATENT DOCUMENTS

| | | |
|---|---|---|
| KR | 10-2003-0033600 A | 5/2003 |
| KR | 10-2006-0109422 A | 10/2006 |
| KR | 10-2007-0046004 A | 5/2007 |
| WO | 96-04525 A | 9/1996 |

* cited by examiner

DEMODULATION DEVICE, AND DEMODULATION INTEGRATED DEVICE AND MODULATION AND DEMODULATION INTEGRATED DEVICE USING THE SAME

CROSS REFERENCE RELATED APPLICATION

This application claims foreign priority of Korean Patent Application No. 10-2012-0031427, filed on Mar. 28, 2012 and Korean Patent Application No. 10-2012-0133050, filed on Nov. 22, 2012, which are incorporated by reference in their entirety into this application.

TECHNICAL FIELD

The present invention relates to a demodulation device, and a demodulation integrated device and a modulation and demodulation integrated device using the same and, more particularly, to a demodulation device that is capable of demodulating various modulation signals using the phase locking characteristics of spin devices, and a demodulation integrated device and a modulation and demodulation integrated device using the same.

BACKGROUND ART

In conventional communication systems, an electronic circuit is used to demodulate an amplitude or frequency modulated wireless signal.

For example, a multi-mode wireless transmission system disclosed in Korean Patent Application No. 10-1999-0007404 can perform multi-mode wireless communication in such a manner that functions common to respective communication methods are shared as common modulation and demodulation functions and functions different between the respective communication methods are provided as different modulation and demodulation functions by forming electronic circuits separately provided for the respective communication methods.

Furthermore, a wireless communication system and a wireless digital receiver for use in the system disclosed in Korean Patent Application No. 10-2006-7000266 can perform wireless communication using different demodulation digital circuits in such a manner that an electronic circuit for down-converting a signal into a low-frequency signal, oversampling the signal and demodulating the wireless signal is formed at a base station and an electronic circuit for down-converting a signal into a low-frequency signal, undersampling the signal, and demodulating the wireless signal is formed at a mobile station.

FIG. 1 is a diagram illustrating the configuration of a conventional electronic circuit ASK wireless receiver.

Referring to FIG. 1, a conventional direct conversion-type wireless communication device fabricated based on electronic circuits includes a VCO 40, a PLL frequency locking circuit 50, an RF switch 10, a mixer 20, and a band filter 30. Accordingly, the conventional technology is problematic in that products thereof have a large size and high power consumption, and is also problematic in that the parts thereof are expensive and high-speed communication is limited because the conventional technology is based on a low-speed communication method operating in a narrow band that is achieved by the additional use of a filter.

DISCLOSURE

Technical Problem

Accordingly, the present invention has been made keeping in mind the above problems occurring in the prior art, and an object of the present invention is to provide a demodulation device that is capable of demodulating various modulation signals, such as an amplitude shift keyed (ASK) signal and a frequency shift keyed (FSK) signal, using the phase locking characteristics of spin devices and that is capable of determining whether a harmonic has been introduced by monitoring the amplitude of a fundamental frequency, thereby enabling detection, and a demodulation integrated device and a modulation and demodulation integrated device using the demodulation device.

Technical Solution

In order to accomplish the above object, the present invention provides a demodulation device, including a spin device configured to output an oscillation signal; a phase control unit configured to assign a predetermined phase locking characteristic to the spin device, thereby causing the oscillation signal to be tuned to a modulation signal that is input to the spin device; and a detector configured to demodulate the oscillation signal that is output by the spin device and tuned to the modulation signal, thereby restoring information carried on the oscillation signal.

The phase control unit may include a current generation unit configured to assign a phase locking characteristic to the spin device by applying a predetermined current to the spin device.

The phase control unit may further include a magnetic field generation unit configured to assign a phase locking characteristic to the spin device along with the current generation unit by applying a predetermined magnetic field to the spin device.

The demodulation device may further include a magnetic field detection unit configured to detect the magnetic field applied by the magnetic field generation unit.

The demodulation device may further include a temperature compensation unit configured to detect the temperature of the spin device and to compensate for changes in characteristic attributable to the detected temperature.

The modulation signal may be received from an antenna; and the demodulation device may further include a first amplifier disposed between the antenna and the spin device and configured to amplify the modulation signal.

The demodulation device may further include a second amplifier disposed behind the spin device and configured to amplify the oscillation signal.

If receiving a modulation signal having a frequency of $f_0$, the spin device may recognize the modulation signal as a 2nd harmonic signal and output a phase-locked signal having a frequency of $f_0/2$.

The spin device may include a plurality of spin devices configured to output respective phase-locked signals tuned to specific frequencies of input modulation signals; the phase control unit may include a plurality of phase control units corresponding to the plurality of spin devices, respectively; and the phase control units may cause oscillation signals output by the plurality of the spin devices to be tuned to modulation signals input to the plurality of spin devices.

The detector may include a plurality of detectors corresponding to the plurality of spin devices; and the detectors may restore information carried on the phase-locked signals by demodulating the phase-locked signals output by the plurality of spin devices.

The modulation signals may be received from an antenna; and the demodulation device may further include a plurality of first amplifiers disposed between the antenna and the plurality of spin devices and configured to amplify the modulation signals, and a plurality of second amplifiers disposed behind the plurality of spin devices and configured to amplify the phase-locked signals.

Each of the plurality of phase control units may include a current generation unit configured to assign a phase locking characteristic to the corresponding spin device by applying a predetermined current to the corresponding spin device; and a magnetic field generation unit configured to assign a phase locking characteristic to the corresponding spin device along with the current generation unit by applying a predetermined magnetic field to the corresponding spin device.

The demodulation device may further include a plurality of magnetic field detection units configured to detect magnetic fields applied by the magnetic field generation units; and a temperature compensation unit configured to detect temperatures of the plurality of spin devices and to compensate for changes in characteristic attributable to the detected temperatures.

Furthermore, the present invention provides a demodulation integrated device, including a substrate; a plurality of spin devices configured to receive power from electrodes provided on the substrate, to be operated with the power, and to output oscillation signals; a phase control unit configured to assign predetermined phase locking characteristics to the respective spin devices, thereby causing the oscillation signals to be tuned to modulation signals input to the respective spin devices; and a detector configured to restore information carried on the oscillation signals by demodulating the oscillation signals that are output by the respective spin devices and tuned to the modulation signals.

The phase control unit may include a current generation unit disposed between the electrodes and the plurality of spin devices, to generate currents that assign predetermined phase locking characteristics to the respective spin devices, and to distribute the currents.

The phase control unit may further include a plurality of magnetic field generation units disposed on the respective spin devices and configured to assign phase locking characteristics to the spin devices by applying predetermined magnetic fields to the spin devices.

The demodulation integrated device may further include a current distribution unit disposed between the electrodes and the plurality of magnetic field generation units and configured to distribute and supply currents to the respective magnetic field generation units so that the magnetic field generation units can generate respective magnetic fields.

The demodulation integrated device may further include a temperature compensation unit configured to detect temperatures of the plurality of spin devices and to compensate for changes in characteristic attributable to the detected temperatures.

Furthermore, the present invention provides a modulation and demodulation integrated device, including a substrate; a modulation unit provided on the substrate and configured to transmit a modulation signal; and a demodulation unit provided on the substrate and receive the modulation signal; wherein the demodulation unit includes a plurality of spin devices configured to output oscillation signals; a phase control unit configured to assign predetermined phase locking characteristics to the respective spin devices, thereby causing the oscillation signals to be tuned to modulation signals that are input to the spin devices; and a detector configured to demodulate the oscillation signals that are output by the respective spin devices and tuned to the modulation signals, thereby restoring information carried on the oscillation signals.

The modulation and demodulation integrated device may further include a power distribution unit configured to distribute power to the modulation unit and the demodulation unit.

The modulation and demodulation integrated device may further include a power control unit configured to selectively turn on and off at least any one of the modulation unit and the demodulation unit by controlling output channels of the power distribution unit.

The modulation and demodulation integrated device may further include a shield film provided in at least any one of the modulation unit and the demodulation unit and configured to prevent characteristics of an electric signal flowing through the demodulation unit, from being changed by a surrounding environment.

The modulation and demodulation integrated device may further include a temperature compensation unit configured to detect temperatures of the plurality of spin devices and to compensate for changes in characteristic attributable to the detected temperatures.

Advantageous Effects

The demodulation device according to the present invention can demodulate a modulated signal using the phase locking characteristic of a spin device (STO). The demodulation device is advantageous in that it can demodulate an amplitude phase modulation signal using a single STO or frequency phase modulation signals using a plurality of STOs based on different fundamental frequencies.

Furthermore, the present invention is advantageous in that it enables locking to a desired frequency without requiring a PLL circuit, can replace a reception function without requiring an RF switch, a mixer and a band filter, and enables high-speed communication using the operation characteristic of an STO in which a short stabilization time is provided.

Furthermore, the present invention is advantageous in that a low-cost, low-power demodulation device and a low-cost, low-power micro-size integrated circuit IC can be implemented using one or more STOs that can perform low power operation and can be integrated onto a nano-sized chip.

Moreover, the present invention is advantageous in that it enables detection to be performed by monitoring the amplitude of a fundamental frequency, thereby determining whether a harmonic has been introduced.

Figure 1:
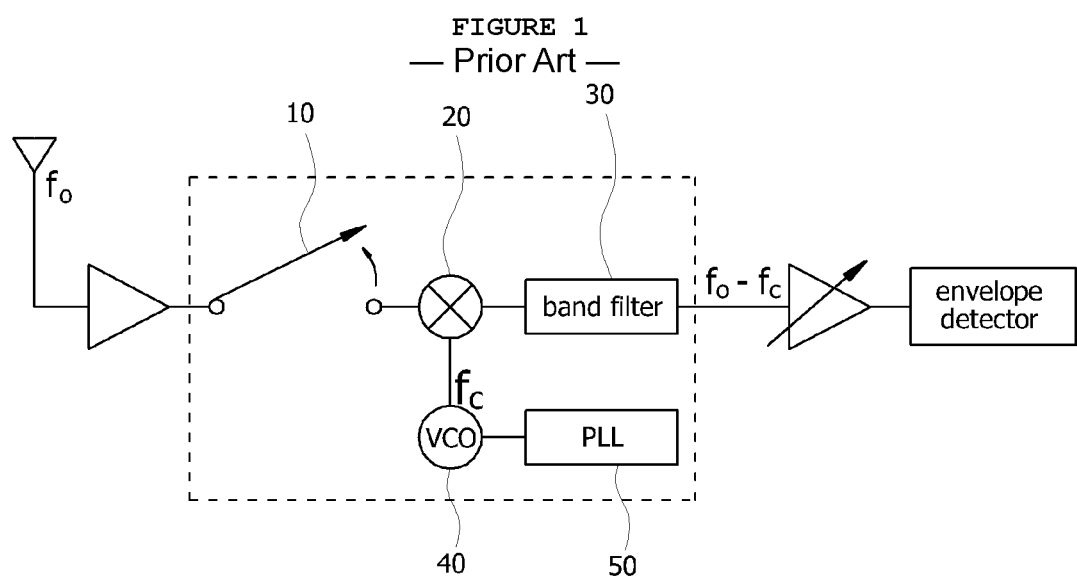
FIG. 1 is a diagram illustrating the configuration of a conventional electronic circuit ASK wireless receiver.

<Description of Reference Numerals of Principal Elements in the Drawings>

| | |
|---|---|
| 10: RF switch | 20: mixer |
| 30: band filter | 40: VCO |
| 50: PLL | 60: demodulation integrated device |
| 70: modulation unit | 80: demodulation unit |
| 90: modulation and demodulation integrated device | |
| 100: spin device | 200: phase control unit |
| 210: current generation unit | |
| 220: magnetic field generation unit | |
| 300: detector | 400: magnetic field detection unit |
| 500: temperature compensation unit | 600: antenna |
| 700: first amplifier | 800: second amplifier |
| 910: substrate | 920: electrode |
| 930: current distribution unit | 940: current wire |
| 950: power distribution unit | 960: power control unit |
| 970: shield film | |

BEST MODE

Embodiments of the present invention will be described in detail with reference to the accompanying drawings. First, it should be noted that the same elements or parts are denoted by the same reference numeral as far as possible throughout the drawings. In the following description of the present invention, detailed descriptions of related well-known functions or configurations will be omitted in order to prevent the gist of the present invention from becoming ambiguous.

Figure 2:
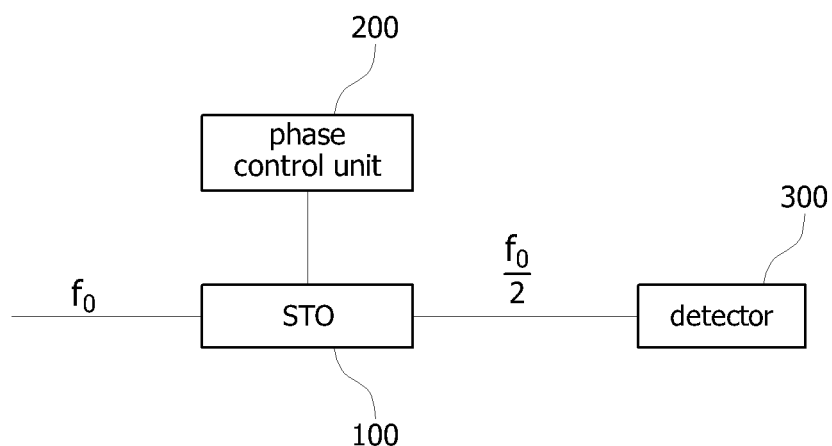
FIG. 2 is a diagram illustrating the first configuration of a demodulation device according to a first embodiment of the present invention.

FIG. 2 is a diagram illustrating the first configuration of a demodulation device according to a first embodiment of the present invention.

Referring to FIG. 2, the demodulation device according to the first embodiment of the present invention includes a spin device 100 configured to receive a modulation signal and output an oscillation signal, a phase control unit 200 configured to assign a predetermined phase locking characteristic to the spin device 100, and a detector 300 configured to demodulate the oscillation signal output from the spin device 100.

The phase control unit 200 may cause the oscillation signal to be tuned to the modulation signal input to the spin device 100.

If the spin device 100 is assigned a predetermined phase locking characteristic by the phase control unit 200, the spin device 100 may output a signal tuned to the frequency of a modulation signal as an oscillation signal. More specifically, the spin device 100 may be formed of a spin-torque oscillator (hereinafter referred to as the "STO"). The STO 100 may output an oscillation signal tuned to an input modulation signal in accordance with a predetermined phase locking characteristic assigned by the phase control unit 200. That is, the STO may output a fundamental frequency, and 2nd, 3rd, 4th and the like harmonics.

In this case, the STO may be implemented as a nano-pillar STO, a nano-contract STO, a magnetic domain wall STO, a vortex STO, or the like.

The phase locking characteristic is the characteristic in which when a frequency, such as the fundamental frequency or 2nd harmonic of the STO 100, is input to the STO as a modulation signal, the fundamental frequency output from the STO 100 is tuned to the input frequency and then output.

Since the STO 100 has functions such as frequency transition and amplitude rise functions in the case of phase locking, a low output level and a poor phase noise characteristic, that is, the characteristics of an STO oscillating frequency, can be mitigated and a frequency oscillated by the STO may be locked to a high-output, low-phase noise frequency. Accordingly, the functions of a VCO, a PLL frequency locking circuit, an RF switch, a mixer and a band filter that are used in a conventional wireless communication device may be replaced.

That is, in a general receiver, a mixer that lowers the frequency of a carrier to a frequency that can be easily detected is used. Since the STO outputs a signal corresponding to a high-output frequency $f_0$ while a carrier $nf_0$ (in this case, n is an integer equal to or higher than 2) is passing therethrough and then performs down conversion, an effect arises in that it can replace the function of the mixer.

In this case, $f_0$ is the frequency of a carrier input to a demodulator, and is a frequency containing information to be demodulated, that is, to be restored or recovered.

For example, when the spin device 100 receives a modulation signal having a frequency of $f_0$, it may recognize the modulation signal as a 2nd harmonic signal and output a phase-locked signal having a frequency of $f_0/2$.

More specifically, if an $f_0$ signal transferred via sky waves is input to the STO to which a phase locking characteristic has been assigned, the STO may recognize the $f_0$ signal as a 2nd harmonic signal and phase-locks an $f_0/2$ signal as a fundamental signal, with the result that an $f_0/2$ signal, that is, half of the $f_0$ frequency via sky waves, can be obtained from the STO signal. In this case, if the $f_0$ frequency signal transferred via sky waves is an amplitude shift keyed (ASK) signal, an ASK modulated $f_0/2$ signal can be obtained through the phase locking of the STO.

Whether a harmonic has been introduced may be determined using the above-described characteristic of the spin device 100.

For example, if the STO that outputs an A sin $2\pi f_0 t$ signal as a fundamental signal outputs an (A×C)sin $2\pi f_0 t$ signal in response to the input of a modulation signal transferred via sky waves, a high amplitude (A×C) is found at frequency $f_0$. Accordingly, it may be determined that microwaves corresponding to a harmonic signal, for example, B sin $2\pi f_0 t$ (in this case, m is a real number multiple of the fundamental frequency $f_0$) or B sin $2\pi n f_0 t$ (in this case, n is an integer multiple of the fundamental frequency $f_0$ equal to or larger than 2), has been introduced into the modulation signal input to the STO.

The detector 300 demodulates the oscillation signal tuned to the modulation signal output from the spin device 100, thereby restoring information carried on the oscillation signal.

More specifically, the detector 300 may be formed of an envelope detector using a half-wave rectifier circuit diode. In this case, the detector 300 monitors the amplitude of an oscillation signal output from the spin device 100, thereby determining whether a harmonic signal has been introduced into the spin device 100 as a modulation signal.

That is, the detector 300 monitors the amplitude (A×C) of an (A×C)sin $2\pi f_0 t$ signal output by the STO in response to the input of the modulation signal, thereby determining whether a B sin $2\pi m f_0 t$ signal (in this case, m is a real number multiple of the fundamental frequency $f_0$) or a B sin $2\pi m f_0 t$ signal (in this case, n is an integer multiple of the fundamental frequency $f_0$ equal to or larger than 2) corresponding to harmonic signal has been introduced as the modulation signal.

MODE FOR INVENTION

Embodiments of the present invention will be described in detail with reference to the accompanying drawings. First, it should be noted that the same elements or parts are denoted by the same reference numeral as far as possible throughout the drawings. In the following description of the present invention, detailed descriptions of related well-known functions or configurations will be omitted in order to prevent the gist of the present invention from becoming ambiguous.

FIGS. 2 to 8 are diagram illustrating various examples of the configuration of a demodulation device according to a first embodiment of the present invention.

Referring to FIG. 2, the demodulation device according to the first embodiment of the present invention includes a spin device 100 configured to receive a modulation signal and output an oscillation signal, a phase control unit 200 configured to assign a predetermined phase locking characteristic to the spin device 100, and a detector 300 configured to demodulate the oscillation signal output from the spin device 100.

The phase control unit 200 may cause the oscillation signal to be tuned to the modulation signal input to the spin device 100.

If the spin device 100 is assigned a predetermined phase locking characteristic by the phase control unit 200, the spin device 100 may output a signal tuned to the frequency of a modulation signal as an oscillation signal. More specifically, the spin device 100 may be formed of a spin-torque oscillator (hereinafter referred to as the "STO"). The STO 100 may output an oscillation signal tuned to an input modulation signal in accordance with a predetermined phase locking characteristic assigned by the phase control unit 200. That is, the STO may output a fundamental frequency, and 2nd, 3rd, 4th and the like harmonics.

In this case, the STO may be implemented as a nano-pillar STO, a nano-contract STO, a magnetic domain wall STO, a vortex STO, or the like.

The phase locking characteristic is the characteristic in which when a frequency, such as the fundamental frequency or 2nd harmonic of the STO 100, is input to the STO as a modulation signal, the fundamental frequency output from the STO 100 is tuned to the input frequency and then output.

Since the STO 100 has functions such as frequency transition and amplitude rise functions in the case of phase locking, a low output level and a poor phase noise characteristic, that is, the characteristics of an STO oscillating frequency, can be mitigated and a frequency oscillated by the STO may be locked to a high-output, low-phase noise frequency. Accordingly, the functions of a VCO, a PLL frequency locking circuit, an RF switch, a mixer and a band filter that are used in a conventional wireless communication device may be replaced.

That is, in a general receiver, a mixer that lowers the frequency of a carrier to a frequency that can be easily detected is used. Since the STO outputs a signal corresponding to a high-output frequency $f_0$ while a carrier $n f_0$ (in this case, n is an integer equal to or higher than 2) is passing therethrough and then performs down conversion, an effect arises in that it can replace the function of the mixer.

In this case, $f_0$ is the frequency of a carrier input to a demodulator, and is a frequency containing information to be demodulated, that is, to be restored or recovered.

For example, when the spin device 100 receives a modulation signal having a frequency of $f_0$, it may recognize the modulation signal as a 2nd harmonic signal and output a phase-locked signal having a frequency of $f_0/2$.

More specifically, if an $f_0$ signal transferred via sky waves is input to the STO to which a phase locking characteristic has been assigned, the STO may recognize the $f_0$ signal as a 2nd harmonic signal and phase-locks an $f_0/2$ signal as a fundament signal, with the result that an $f_0/2$ signal, that is, half of the $f_0$ frequency via sky waves, can be obtained from the STO signal. In this case, if the $f_0$ frequency signal transferred via sky waves is an amplitude shift keyed (ASK) signal, an ASK modulated $f_0/2$ signal can be obtained through the phase locking of the STO.

Whether a harmonic has been introduced may be determined using the above-described characteristic of the spin device 100.

For example, if the STO that outputs an A sin $2\pi f_0 t$ signal as a fundamental signal outputs an (A×C)sin $2R f_0 t$ signal in response to the input of a modulation signal transferred via sky waves, a high amplitude (A×C) is found at frequency $f_0$. Accordingly, it may be determined that microwaves corresponding to a harmonic signal, for example, B sin $2R\pi m f_0 t$ (in this case, m is a real number multiple of the fundamental frequency $f_0$) or B sin $2\pi n f_0 t$ (in this case, n is an integer multiple of the fundamental frequency $f_0$ equal to or larger than 2), has been introduced into the modulation signal input to the STO.

The detector 300 demodulates the oscillation signal tuned to the modulation signal output from the spin device 100, thereby restoring information carried on the oscillation signal.

More specifically, the detector 300 may be formed of an envelope detector using a half-wave rectifier circuit diode. In this case, the detector 300 monitors the amplitude of an oscillation signal output from the spin device 100, thereby determining whether a harmonic signal has been introduced into the spin device 100 as a modulation signal.

That is, the detector 300 monitors the amplitude (A×C) of an (A×C)sin $2\pi f_0 t$ signal output by the STO in response to the input of the modulation signal, thereby determining whether a B sin $2\pi mf_0 t$ signal (in this case, m is a real number multiple of the fundamental frequency $f_0$) or a B sin $2\pi mf_0 t$ signal (in this case, n is an integer multiple of the fundamental frequency $f_0$ equal to or larger than 2) corresponding to harmonic signal has been introduced as the modulation signal.

Figure 3:
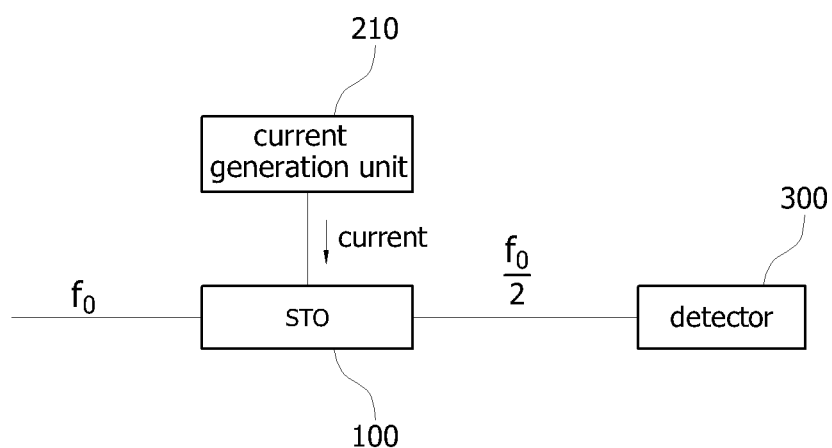
FIG. 3 is a diagram illustrating the second configuration of the demodulation device according to the first embodiment of the present invention.

Referring to FIG. 3, the phase control unit 200 may include a current generation unit 210 that assigns a predetermined phase locking characteristic to the spin device 100.

The current generation unit 210 may assign a phase locking characteristic to the spin device 100 so that, when a predetermined current is applied to the spin device 100, the spin device 100 outputs the phase-locked signal. In this case, the current generation unit 210 is formed of a constant current circuit or a constant voltage circuit, and thus is able to apply a predetermined current to the spin device 100.

Figure 4:
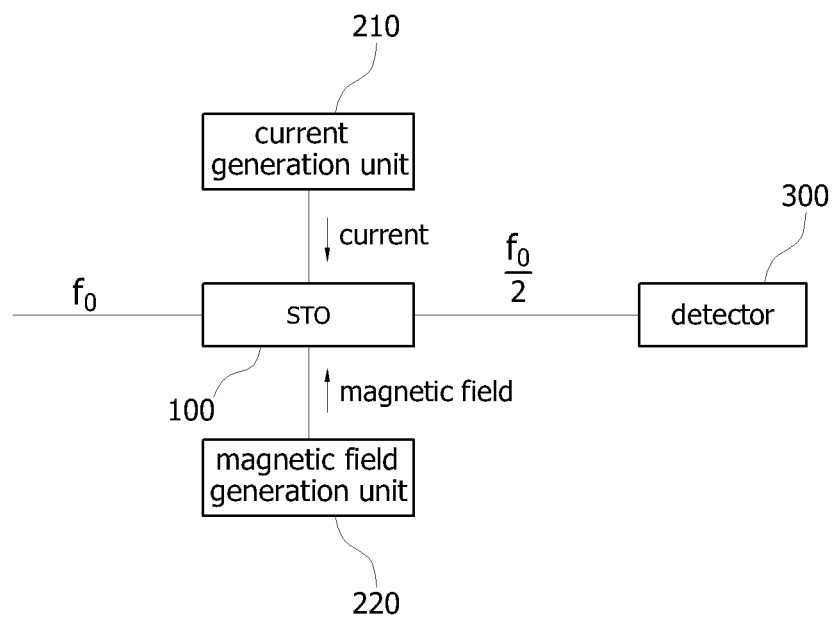
FIG. 4 is a diagram illustrating the third configuration of the demodulation device according to the first embodiment of the present invention.

Referring to FIG. 4, the phase control unit 200 may further include a magnetic field generation unit 220 that assigns a predetermined phase locking characteristic to the spin device 100.

The magnetic field generation unit 220 applies a predetermined magnetic field to the spin device 100, thereby assigning the phase locking characteristic to the spin device 100 along with the current generation unit 210. The magnetic field generation unit 220 may control the frequency of the phase-locked signal by generating a valid magnetic field capable of changing the characteristics of the STO.

In this case, when the magnetic field generation unit 220 is, for example, a hard disk media, the present invention may further include a fundamental oscillator that outputs the fundamental frequency $f_0$, although this is not shown in the drawings. The spin device 100 is a hard disk head that detects the magnetic pattern of the hard disk media, and may read the magnetic pattern information of the hard disk media using variations in the amplitude or frequency of the $f_0/2$ signal.

Figure 5:
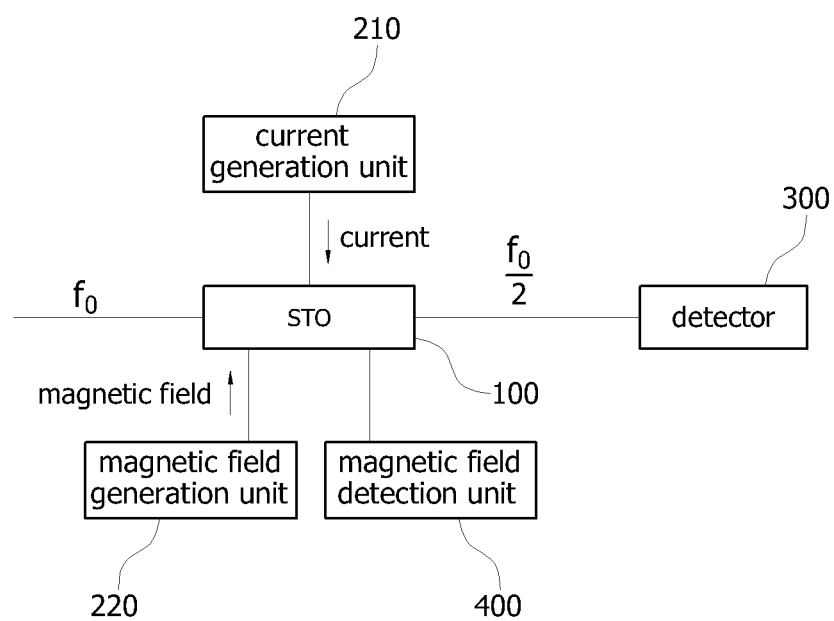
FIG. 5 is a diagram illustrating the fourth configuration of the demodulation device according to the first embodiment of the present invention.

Referring to FIG. 5, the demodulation device according to a first embodiment of the present invention may further include a magnetic field detection unit 400 that detects a magnetic field applied by the magnetic field generation unit 220 and controls changes in the frequency of the phase-locked signal. The frequency of the phase-locked signal output from the spin device 100 is controlled by the intensities of an applied current and magnetic field. If the magnetic field detection unit 400 detects a magnetic field additionally applied from the outside as well as a magnetic field applied by the magnetic field generation unit 220, a change of the frequency of the phase-locked signal may be controlled by adjusting the intensity of the current applied by the current generation unit 210 to a value lower than a previous value.

In this case, the magnetic field detection unit 400 may be formed of a Hall sensor, a GMR sensor, a TMR sensor or the like in order to measure the intensity of the magnetic field that is applied by the spin device 100.

Meanwhile, when the temperature detected by the spin device 100 and the intensity of current applied by the spin device 100 are constant, the frequency, that is, the precession speed of the spin, increases as the intensity of the magnetic field increases. When the frequency generated by the spin device 100 is detected, the magnetic field applied by the magnetic field generation unit 220 can be detected. Accordingly, the magnetic field detection unit 400 is an element that may be omitted from the present invention.

Figure 6:
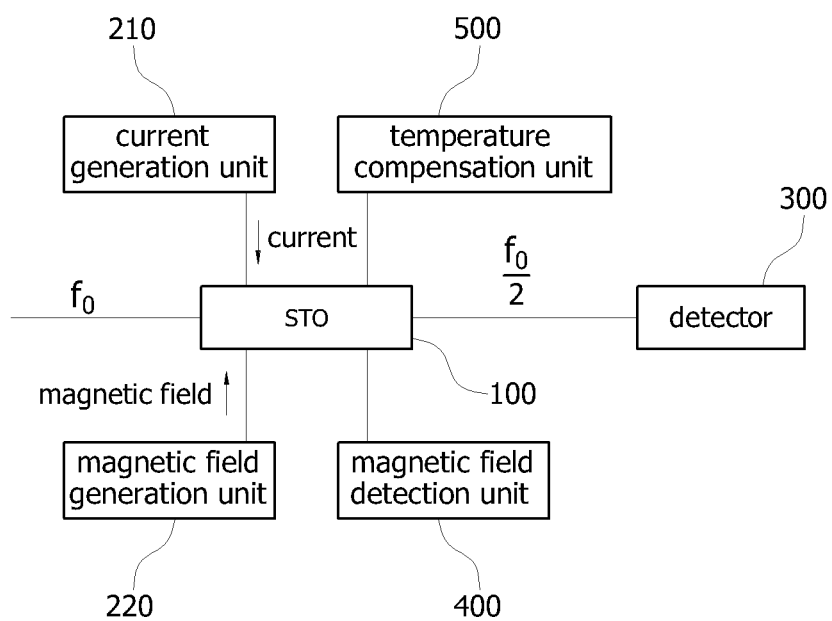
FIG. 6 is a diagram illustrating the fifth configuration of the demodulation device according to the first embodiment of the present invention.

Referring to FIG. 6, the demodulation device according to the first embodiment of the present invention may further include a temperature compensation unit 500 that detects the temperature of the spin device 100 and compensates for a change in characteristic attributable to the detected temperature. More specifically, the temperature compensation unit 500 may compensate for a change in the temperature characteristic of the spin device 100 using a compensation method based on a function of temperature.

As the temperature increases, the amplitude "a" of the phase-locked signal output from the spin device 100 increases. The change in characteristic attributable to the detected temperature can be compensated for in such a manner that the amplitude of the phase-locked signal is kept uniform by multiplying the amplitude by a compensation constant (b<1) that reduces the amplitude if the temperature detected from the spin device 100 is higher than a reference temperature and multiplying the amplitude by a compensation constant (b>1) that increases the amplitude if the detected temperature is lower than the reference temperature. For this purpose, the temperature compensation unit 500 may include a temperature sensor configured to detect the temperature of the spin device 100, and a temperature compensation circuit configured to compensate for a change in characteristic attributable to the temperature of the spin device 100.

Meanwhile, the temperature sensor included in the temperature compensation unit 500 may be omitted. That is, since the resistance of the spin device 100 is proportional to the reciprocal of the temperature, the temperature of the spin device 100 may be measured using that. For example, when current is measured by applying voltage to the spin device 100, or when voltage is measured by applying current to the spin device 100, the resistance of the spin device 100 can be calculated pursuant to Ohm's law, and thus the temperature of the spin device 100 can be measured using the resistance. In this case, the structure of the temperature compensation unit 500 can be simplified and the number of manufacturing processes can be reduced.

Figure 7:
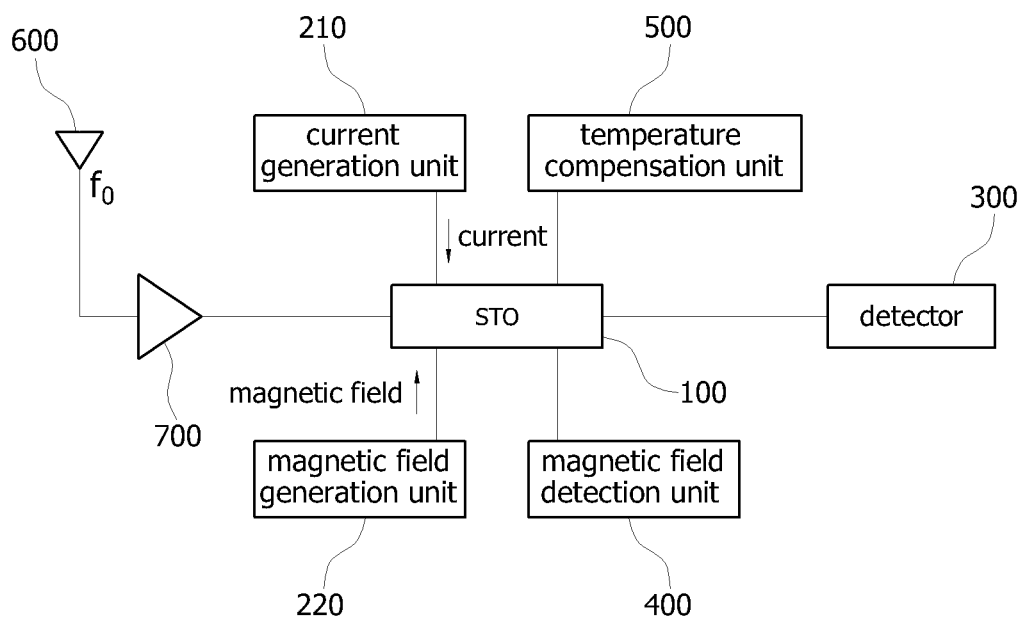
FIG. 7 is a diagram illustrating the sixth configuration of the demodulation device according to the first embodiment of the present invention.

Referring to FIG. 7, the demodulation device according to the first embodiment of the present invention may further include an antenna 600 configured to receive a modulation signal, and a first amplifier 700 configured to amplify the modulation signal.

The antenna 600 may receive a modulation signal transferred via sky waves. In this case, the modulation signal may be a signal that is amplitude/phase-modulated and then transmitted. Thus, in the present invention, the sources of microwaves introduced into the spin device 100 may be obtained from the antenna 600.

The first amplifier 700 may be formed of a low-noise amplifier 600 that is disposed between the antenna 600 and the spin device 100.

Generally, the intensity of a modulation signal received via the antenna 600 is weak, and thus the first amplifier functions to amplify the modulation signal.

Figure 8:
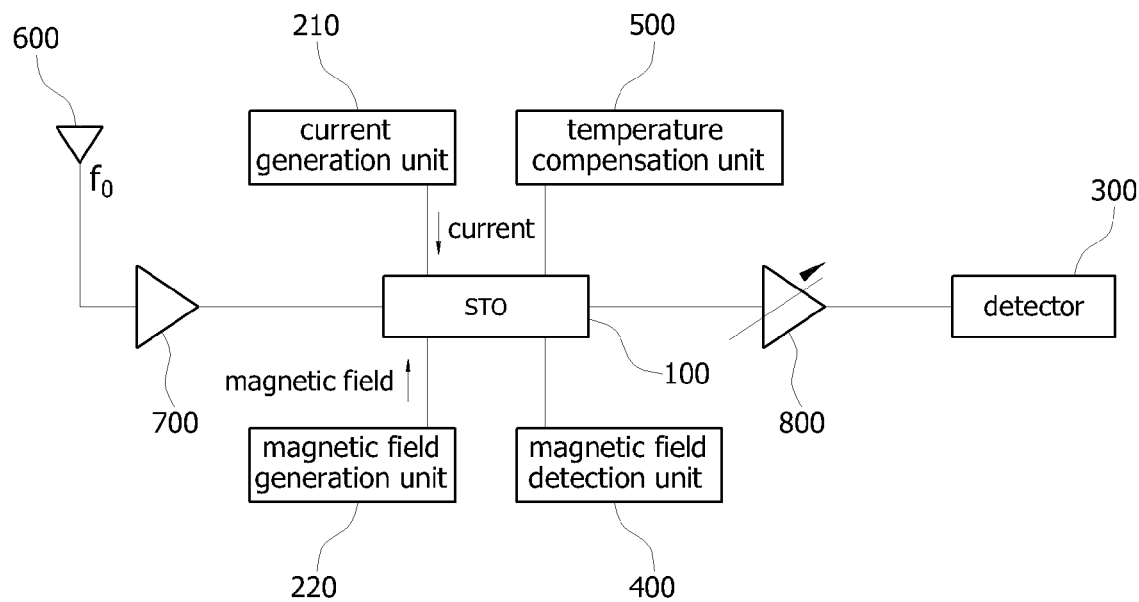
FIG. 8 is a diagram illustrating the seventh configuration of the demodulation device according to the first embodiment of the present invention.

Referring to FIG. 8, the demodulation device according to the first embodiment of the present invention may further include a second amplifier 800 that amplifies an oscillation signal.

The second amplifier 800 may be formed of a variable amplifier that is disposed behind the spin device 100. The second amplifier 800 functions to amplify the oscillation signal if the amplitude of the oscillation signal is lower than a sensitivity level at which the detector 300 can perform detection.

In the present invention, the first amplifier 700 and the second amplifier 800 may be provided for long-distance wireless communication.

Meanwhile, in short-distance wireless communication, the intensity of a modulation signal received via the antenna 600 is strong, and the amplitude of an oscillation signal output from the spin device 100 may be higher than a sensitivity level at which the detector 300 can perform detection. In this case, the first amplifier 700 and the second amplifier 800 may be omitted from the configuration of the present invention.

As described above, in the demodulation device according to the first embodiment of the present invention, the antenna 600 receives an ASK modulation signal transferred via the air, and if necessary, the modulation signal is amplified by the first amplifier 700.

Thereafter, a current and a magnetic field are set for the STO by the phase control unit 200 so that when an $f_0$ frequency wireless signal power level equal to or higher than a reference is input to the STO, the STO recognizes the $f_0$ frequency signal input via the antenna 600 as a 2nd harmonic signal and exhibits a phase locking characteristic.

As a result, the STO outputs a signal that is tuned to the $f_0$ frequency received via the antenna 600 and locked to the $f_0/2$ frequency.

As described above, the locked half frequency signal is input to and amplified by the second amplifier 800 if necessary, and finally information carried on the wireless signal may be obtained by the detector 300.

Figure 9:
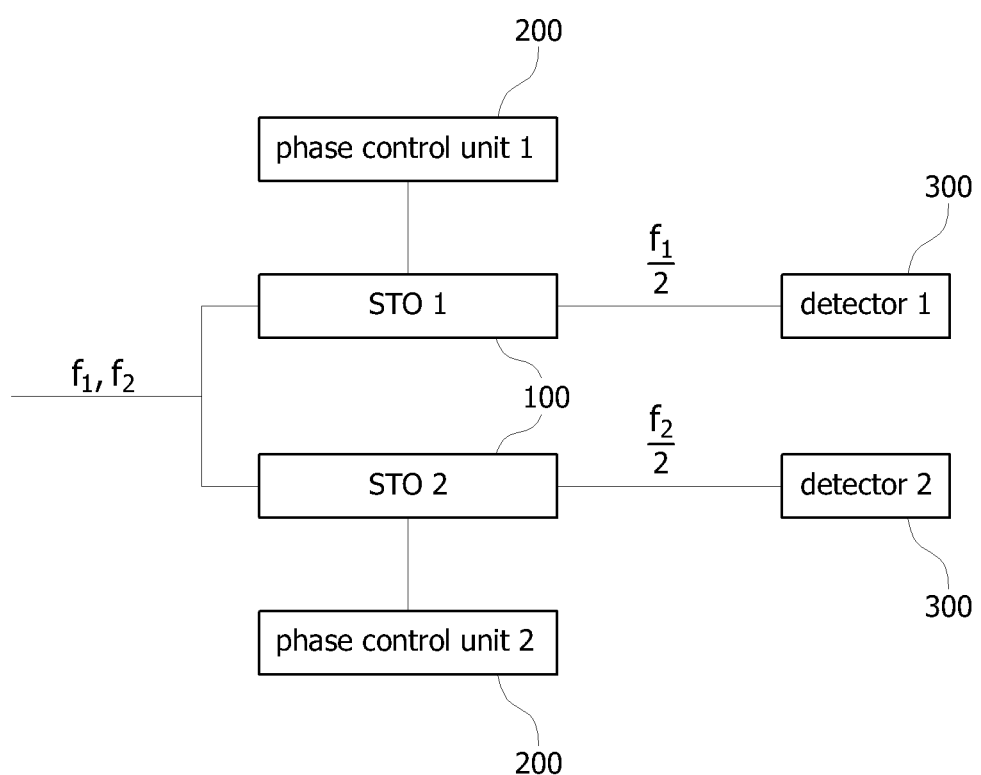
FIG. 9 is a diagram illustrating the first configuration of a demodulation device according to a second embodiment of the present invention.
Figure 10:
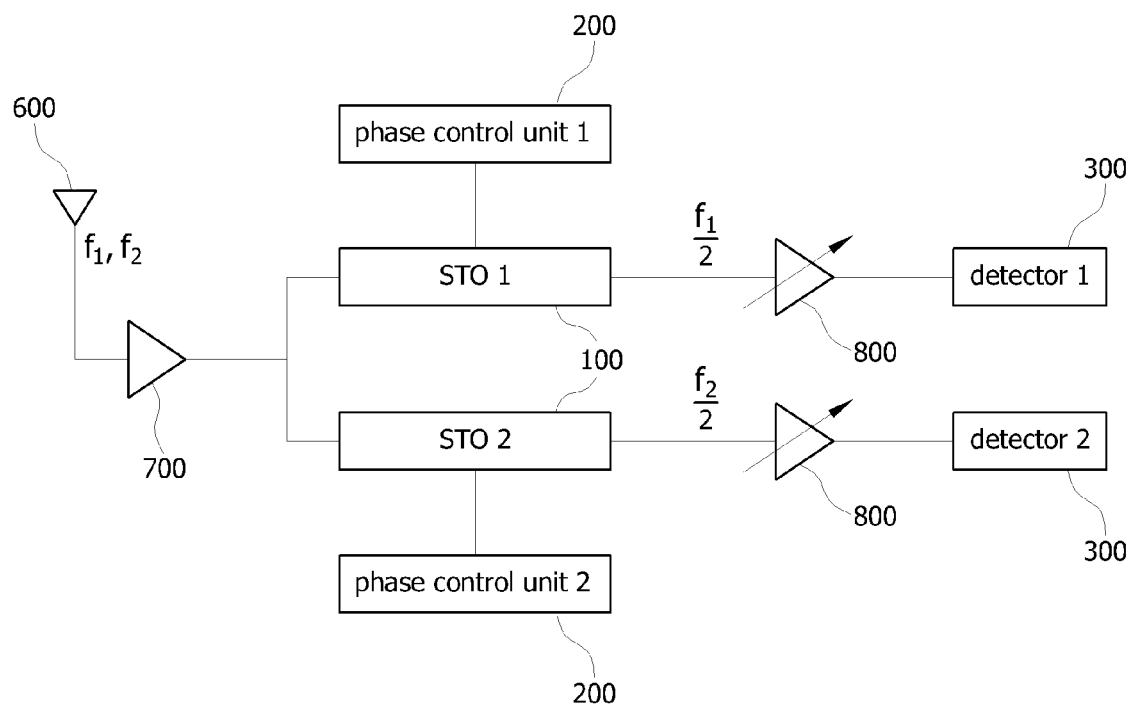
FIG. 10 is a diagram illustrating the second configuration of the demodulation device according to the second embodiment of the present invention.
Figure 11:
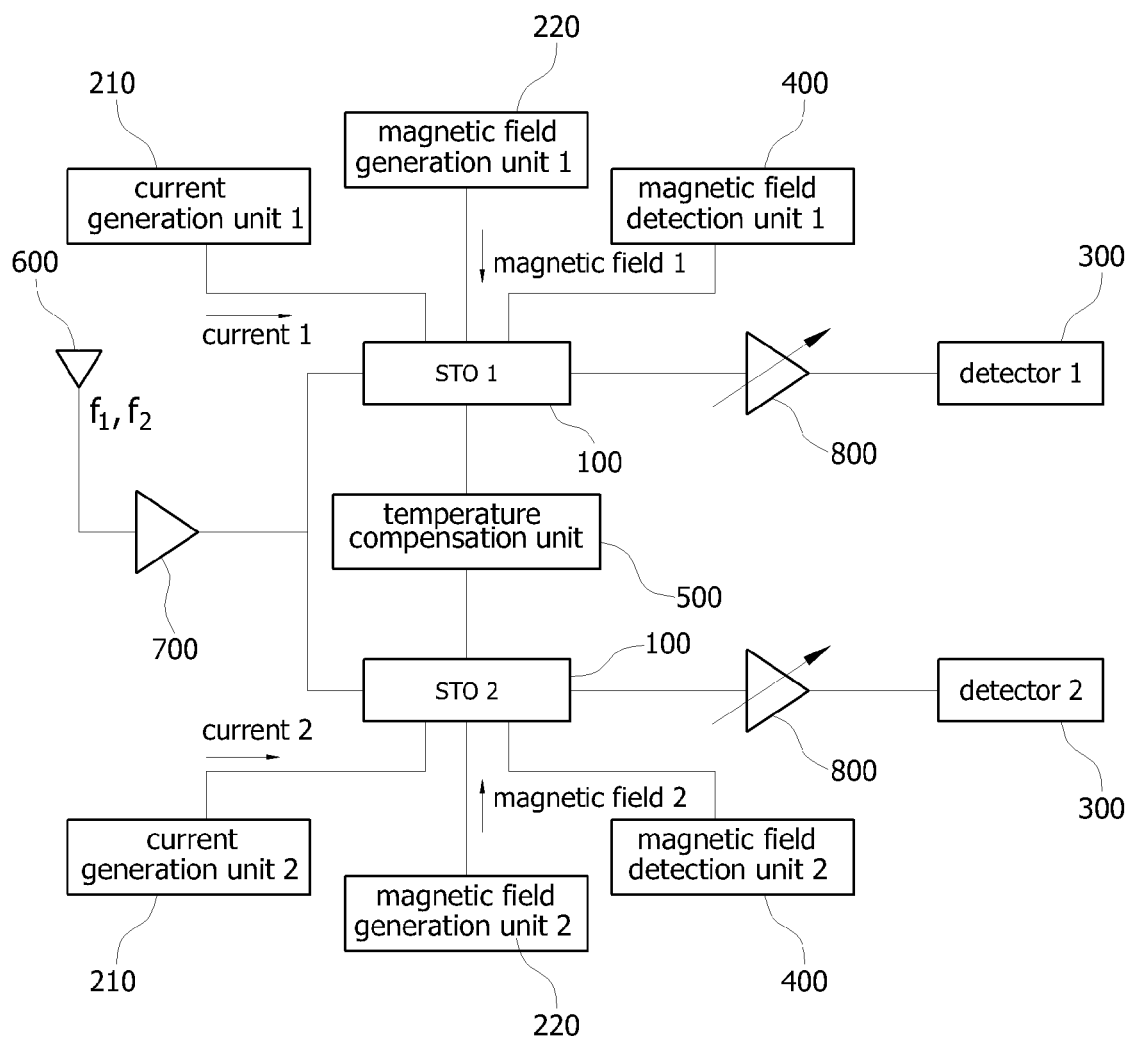
FIG. 11 is a diagram illustrating the third configuration of the demodulation device according to the third embodiment of the present invention.

FIGS. 9 to 11 are diagrams illustrating various examples of the configuration of a demodulation device according to a second embodiment of the present invention.

Referring to FIG. 9, the demodulation device according to the second embodiment of the present invention includes a plurality of spin devices 100, a plurality of phase control unit 200, and a plurality of detectors 300. The plurality of spin devices 100 may output respective phase-locked signals tuned to specific frequencies of input modulation signals pursuant to the phase locking characteristics assigned by the phase control unit 200. For example, if receiving signals FSK-modulated using two frequencies, that is, $f_1$ and $f_2$, the spin devices 100 may recognize the modulation signals as 2nd harmonic signals and output phase-locked signals having frequencies of $f_1/2$ and $f_2/2$.

FIG. 9 illustrates an example in which the spin devices 100 are formed of two STOs (STO 1 and STO 2), and the phase control unit 200 are formed of two phase control units (phase control unit 1, and phase control unit 2). When an $f_1$ signal transferred via sky waves is input to STO 1 to which a phase locking characteristic has been assigned and an $f_2$ signal transferred via sky waves is input to STO 2 to which a phase locking characteristic has been assigned, the STO 1 outputs an $f_1/2$ signal and the STO 2 outputs an $f_2/2$ signal along two paths, and thus locked half frequency signals may be obtained.

That is, when the phase control unit 1 causes the STO 1 to be phase-tuned to the $f_1$ signal, the STO 1 reacts only to the $f_1$ signal and then outputs the $f_1/2$ signal as the output signal of the STO 1. Pursuant to the same principle, when the phase control unit 2 causes the STO 2 to be phase-tuned to the $f_2$ signal, the STO 2 reacts only to the $f_2$ signal and then outputs the $f_2/2$ signal as the output signal of the STO 2.

Meanwhile, although the method of arraying and using two STOs in order to demodulate a sky wave signal modulated using two frequencies, that is, a 1-level FSK modulated signal, has been described above, this is merely an example and various modifications and variations may be made. That is, in the case of FSK modulation having an m-level exponent, an m-level modulation device may be implemented by arraying a number of STOs equal to or larger than $2^m$. A demodulation device suitable for an STO array-based frequency hopping system may be designed by extending the above-described characteristic.

The phase control units 200 correspond to the spin devices 100, respectively. The phase control units 200 assign predetermined phase locking characteristics to the respective spin devices 100, thereby causing oscillation signals to be tuned to a modulation signal input to the spin devices 100.

The plurality of detectors 300 are provided to correspond to the spin devices 100, respectively, and may restore information carried on the phase-locked signals by demodulating the phase-locked signals output by the spin devices 100. In this case, like the detector included in the demodulation device according to the first embodiment of the present invention, each of the detectors 300 may be formed of an envelope detector using the half-wave rectifier circuit of a diode, and may determine whether a harmonic signal has been introduced into a corresponding spin device 100 as a modulation signal by monitoring the amplitude of an oscillation signal output by the spin device 100.

Referring to FIG. 10, the demodulation device according to the second embodiment of the present invention may further include an antenna 600, a first amplifiers 700 configured to amplify the modulation signals, and a second amplifier 800 configured to amplify the oscillation signals.

The antenna 600 may receive modulation signals transferred via sky waves. In this case, the modulation signals may be signals that are frequency shift keyed (hereinafter referred to as "FSK") and then transmitted.

The first amplifier 700 is formed of a low-noise amplifier disposed between the antenna 600 and the spin device 100, and thus may amplify the modulation signals.

The second amplifiers 800 may be formed of a plurality of variable amplifiers that are disposed behind the plurality of the spin devices 100 and amplify the phase-locked signals.

Referring to FIG. 11, each of the plurality of phase control units 200 may include a current generation unit 210 and a magnetic field generation unit 220 that assign a predetermined phase locking characteristic to a corresponding spin device 100.

More specifically, the phase control unit 200 may apply a current and a magnetic field to the corresponding spin device 100 so that the spin device 100 may receive only a modulation signal of a specific frequency and output a phase-locked signal tuned to the specific frequency of the modulation signal.

Referring to FIG. 11, the current generation unit 1 may apply current 1, that is, a specific current, so that the STO 1 may be tuned in phase to the $f_1$ signal, and the current generation unit 2 may apply current 2, that is, another specific current, so that the STO 2 may be tuned in phase to the $f_2$ signal.

Furthermore, the magnetic field generation unit 1 may apply magnetic field 1, that is, a valid magnetic field, so that the STO 1 may be tuned in phase to the $f_1$ signal, and the magnetic field generation unit 2 may apply magnetic field 2, that is, a valid magnetic field, so that the STO 2 may be tuned in phase to the $f_2$ signal.

As described above, the phase control unit 1 may cause the STO 1 to be tuned in phase to the $f_1$ signal using the current 1 and the magnetic field 1. Pursuant to the same principle, the phase control unit 2 may cause the STO 2 to be tuned in phase to the $f_2$ signal using the current 2 and the magnetic field 2.

Furthermore, the demodulation device according to the second embodiment of the present invention, as illustrated in FIG. 11, may further include a plurality of magnetic field detection units 400 configured to detect magnetic fields applied to the respective magnetic field generation units 220 and a temperature compensation unit 500 configured to detect the temperatures of the plurality of the spin devices 100 and compensate for compensate for changes in characteristic attributable to the detected temperatures. In this case, since the configurations and functions of the magnetic field detection units 400 and the temperature compensation unit 500 are substantially the same as those of the magnetic field detection unit and the temperature compensation unit included in the demodulation device according to the first embodiment of the present invention, detailed descriptions thereof will be omitted.

As described above, in the demodulation device according to the second embodiment of the present invention, FSK modulated $f_1$ and $f_2$ sky wave signals received via the antenna 600 are amplified to a sufficient level by the first amplifier 700.

Thereafter, the amplified $f_1$ signal is input to the STO 1, and the amplified $f_2$ signal is input to the STO 2. Specific currents and valid magnetic fields are set for the STO 1 and the STO 2 by the phase control units 200 corresponding to the respective STO 1 and STO 2 so that the STO 1 and the STO 2 recognize the $f_1$ and $f_2$ frequencies input from the antenna 600 as 2nd harmonic signals and exhibit phase locking characteristics. In this case, current 1 and magnetic field 1 are set for the STO 1, and current 2 and magnetic field 2 are set for the STO 2.

As a result, the STO 1 outputs a signal that is tuned to the $f_1$ frequency received via the antenna 600 and locked to the $f_1/2$ frequency, and the STO 2 outputs a signal that is tuned to the f2 frequency and locked to the $f_2/2$ frequency.

As described above, the locked half frequency signal is input to and amplified by the second amplifier 800 if necessary, and finally information carried on the wireless signal is obtained by the detector 300.

A demodulation integrated device according to an embodiment of the present invention will be described in detail with reference to FIGS. 12 to 14.

The demodulation integrated device according to this embodiment of the present invention is fabricated by forming the above-described demodulation devices according to the first and second embodiments of the present invention in a single unit integrated circuit (IC) chip. The demodulation integrated device may be called a spintronic demodulator.

Figure 12:
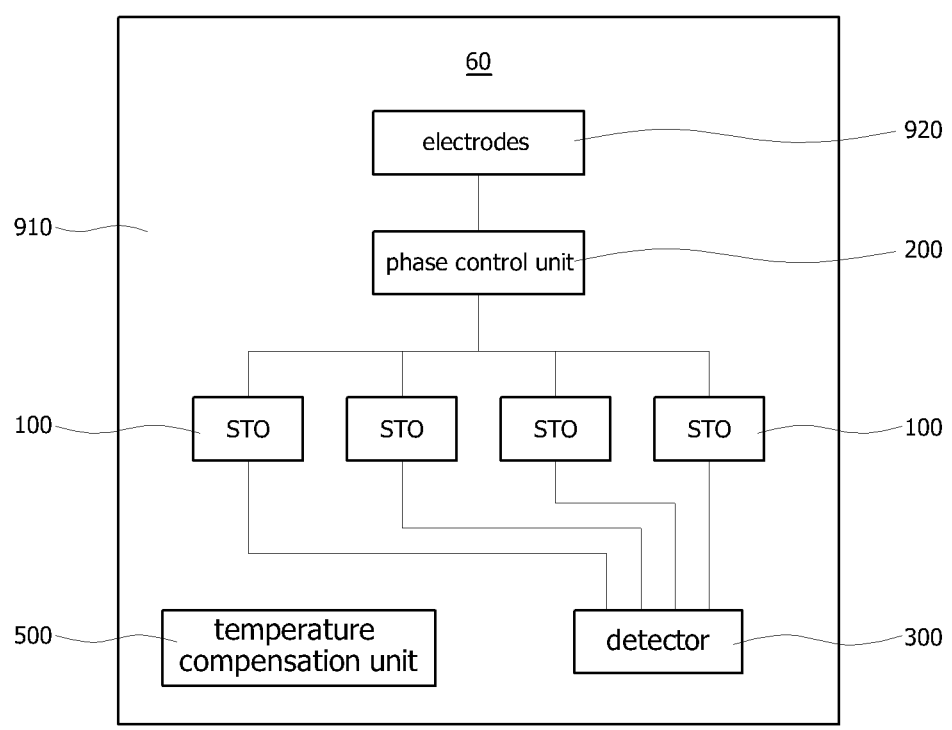
FIG. 12 is a diagram illustrating the configuration of a demodulation integrated device according to an embodiment of the present invention.

FIG. 12 is a diagram illustrating the configuration of the demodulation integrated device according to this embodiment of the present invention. Referring to FIG. 12, the demodulation integrated device may include a substrate 910, and a demodulation device integrated onto the substrate 910. Electrodes 920 configured to apply power to the demodulation device is provided on the substrate 910.

The demodulation device may include the demodulation devices according to the first and second embodiments of the present invention that have been described with reference to FIGS. 2 to 11.

Referring to FIG. 12, the demodulation device of the demodulation integrated device according to this embodiment may include a plurality of spin devices 100, a phase control unit 200 configured to assign phase locking characteristics to the respective spin devices 100, and a detector 300 configured to detect modulation signals output from the plurality of spin devices 100. Furthermore, the demodulation device may further include a temperature compensation unit 500 configured to detect the temperatures of the respective spin devices 100 and to compensate for changes in characteristic attributable to the detected temperatures.

The spin devices 100 may be supplied with power by the electrodes 920, be driven by the power, and output oscillation signals. In this case, the spin devices 100 may be formed of embedded STOs mounted on the substrate 910, and may be connected to a current distribution unit 930 via current wire current wires 940.

In the demodulation integrated device according to this embodiment, the configurations of the spin devices 100, phase control unit 200, detector 300 and temperature compensation unit 500 that constitute the demodulation device are substantially the same as those of the identically named elements of the demodulation devices of the first and second embodiments of the present invention, detailed descriptions thereof will be omitted.

Figure 13:
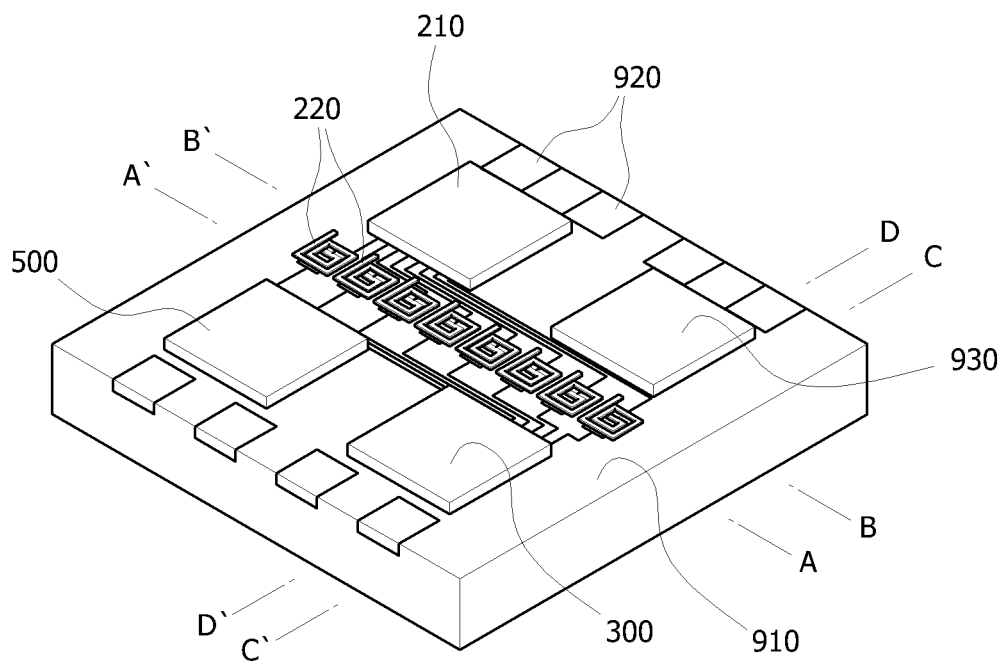
FIG. 13 is a schematic perspective view of the demodulation integrated device according to the embodiment of the present invention.
Figure 14:
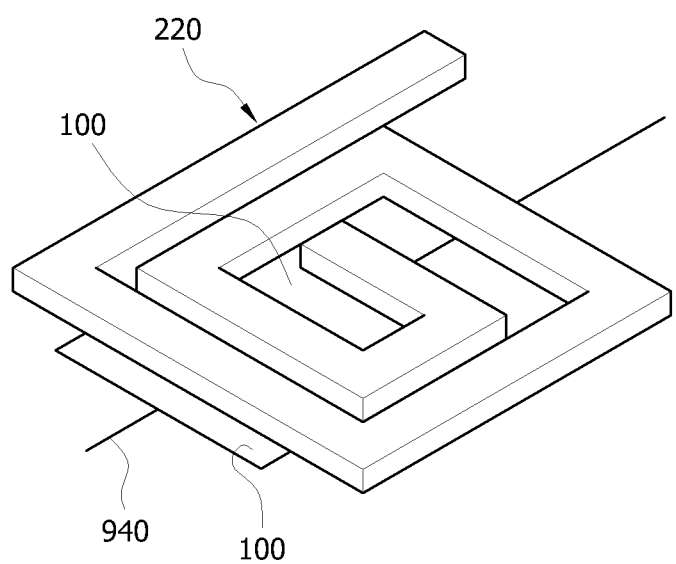
FIG. 14 is a partially enlarged view taken along lines AA', BB', CC' and DD' of FIG. 13.
Figure 15:
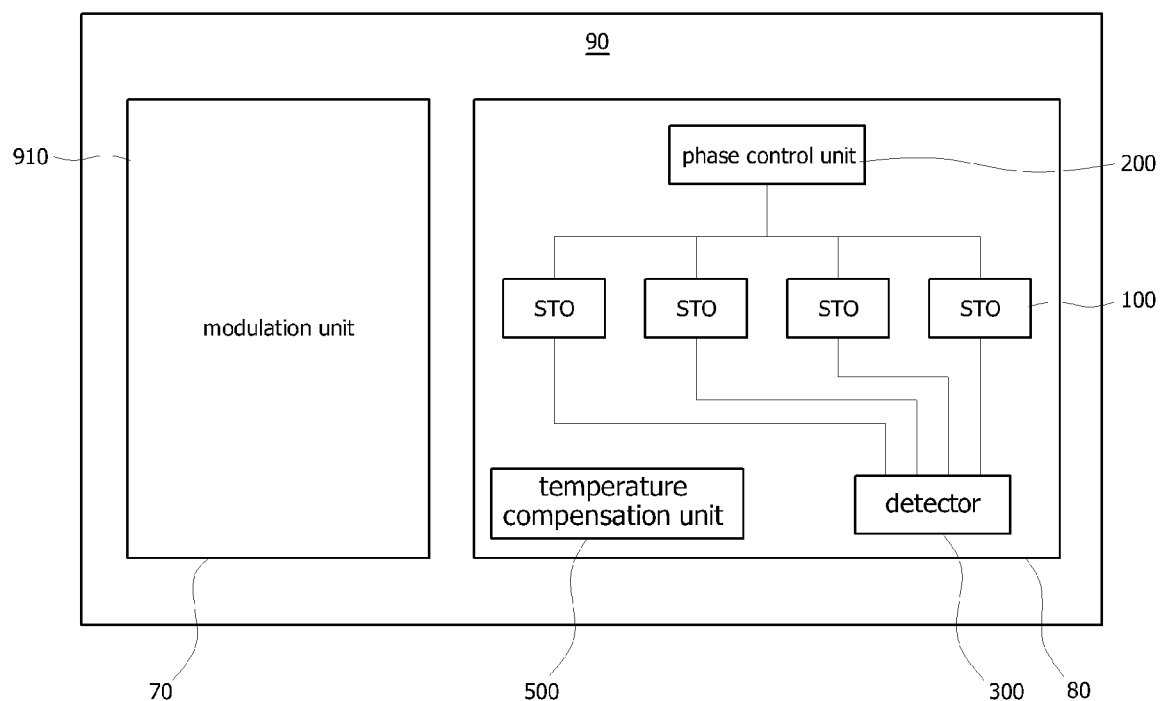
FIG. 15 is a diagram illustrating the first configuration of a modulation and demodulation integrated device according to an embodiment of the present invention.

Referring to FIG. 13, the phase control unit is disposed between the electrode 920 and the plurality of the spin devices 100, and may include a current generation unit 210 that applies currents to the plurality of spin devices. In this case, the current generation unit 210 generates currents that assign predetermined phase locking characteristics to the respective spin devices 100, and distributes the currents to the respective spin devices 100.

Furthermore, the phase control unit may further include a plurality of magnetic field generation units 220 mounted on the respective spin devices 100. The magnetic field generation units 220 apply predetermined magnetic fields to the respective spin devices 100, and assign phase locking characteristics to the respective spin devices 100. The magnetic field generation units 220 may be formed of 2D flat coils integrated onto the substrate 910 according to a patterning process, as illustrated in FIG. 14.

Furthermore, the demodulation integrated device according to this embodiment of the present invention may include a current distribution unit 930 disposed between the electrodes 920 and the plurality of the magnetic field generation units 220, as illustrated in FIG. 13. The current distribution unit 930 may distribute and supply currents to the magnetic field generation units 220 so that the magnetic field generation units 220 can generate respective magnetic fields.

Meanwhile, although not illustrated, the demodulation integrated device according to the present invention may further include magnetic field detection units configured to detect magnetic fields applied by the magnetic field generation units 220 and first and second amplifiers configured to amplify demodulation signals, like the demodulation device according to the present invention.

A modulation and demodulation integrated device according to an embodiment of the present invention will be described in detail with reference to FIGS. 15 to 19.

The modulation and demodulation integrated device according to the embodiment of the present invention is formed by adding a modulation unit to the above-described demodulation integrated device according to the embodiment of the present invention in a single unit IC chip. The modulation and demodulation integrated device may be called a spintronic one-chip MODEM.

The modulation and demodulation integrated device is fabricated by integrating a demodulation unit and an existing spin torque-type oscillating device for a transmitter or modulator into a micro-IC chip. A small size can be achieved by integrating various types of modulation units together.

Figure 16:
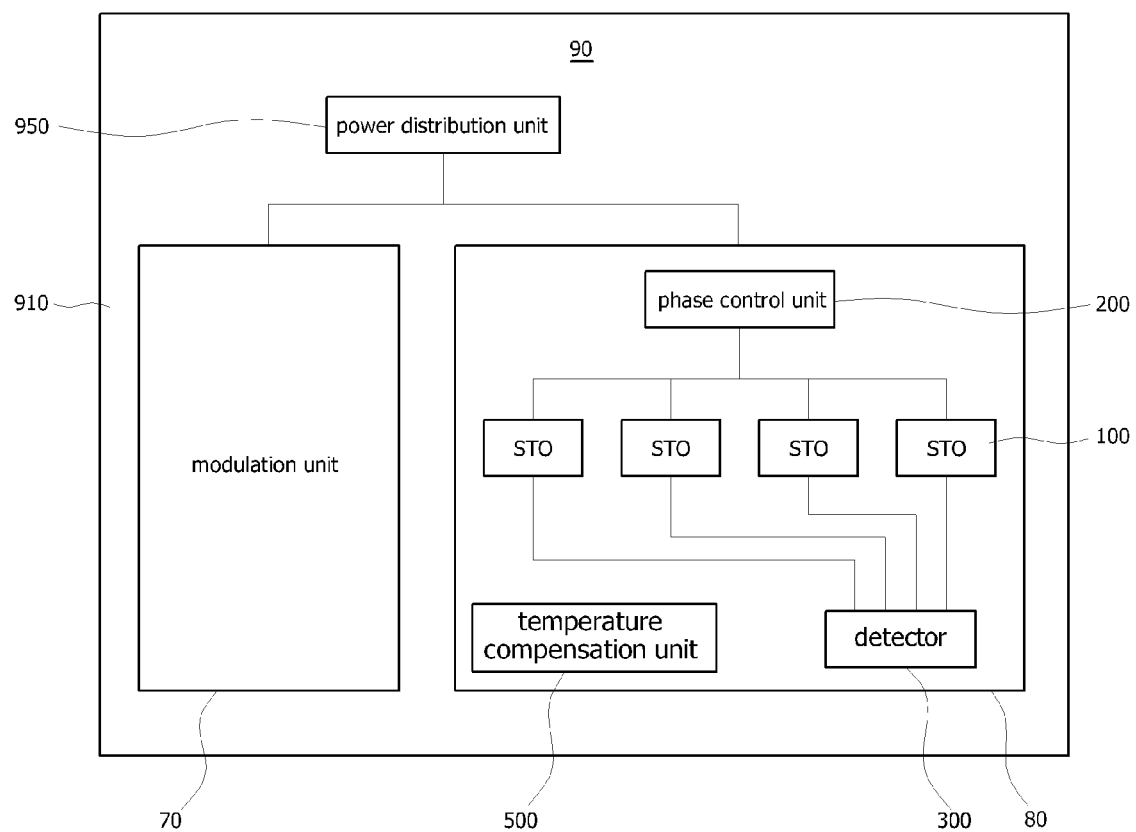
FIG. 16 is a diagram illustrating the second configuration of the modulation and demodulation integrated device according to the embodiment of the present invention.

Referring to FIG. 16, a modulation and demodulation integrated device according to an embodiment of the present invention includes a substrate 910, a modulation unit 70 integrated onto a substrate 910 and configured to transmit a modulation signal, and a demodulation unit 80 integrated onto the substrate 910 and configured to demodulate a received modulation signal.

The demodulation unit 80 includes a plurality of spin devices 100 formed of a plurality of embedded STOs mounted on the substrate 910, a phase control unit 200 configured to assign phase locking characteristics to the respective spin devices 100, and a detector 300 configured to demodulate oscillation signals that are output by the respective spin devices 100 and tuned to the modulation signals.

Figure 19:
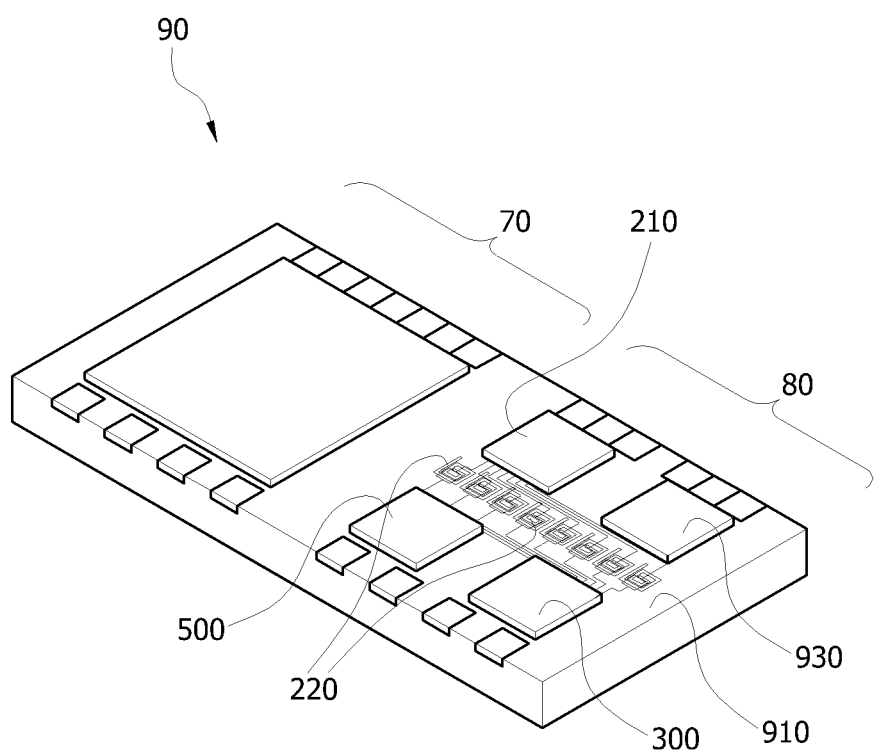
FIG. 19 is a schematic perspective view of the modulation and demodulation integrated device according to the embodiment of the present invention.

Furthermore, as illustrated in FIG. 19, the phase control unit 200 may include a current generation unit 210 configured to assign phase locking characteristics to the respective spin devices 100 by distributing currents to the respective spin devices 100, and magnetic field generation units 220 formed of flat coils and configured to assign phase locking characteristics to the respective spin devices 100 by applying predetermined magnetic fields to the respective spin devices 100. Furthermore, the demodulation unit 80 may further include a temperature compensation unit 500 configured to detect the temperatures of the respective spin devices 100 and compensate for changes in characteristic attributable to the detected temperatures.

In the modulation and demodulation integrated device according to this embodiment, the configurations of the spin devices 100, a phase control unit 200, a detector 300 and the temperature compensation unit 500 that constitute the demodulation device are substantially the same as those of the identically named elements of the demodulation devices of the first and second embodiments of the present invention, detailed descriptions thereof will be omitted.

Furthermore, referring to FIG. 16, the modulation and demodulation integrated device according to this embodiment of the present invention may further include a power distribution unit 950 configured to distribute power to the modulation unit 70 and the demodulation unit 80. The power distribution unit 950 functions to distribute and supply power in order to enable the operations of the modulation unit 70 and the demodulation unit 80 to be performed without any problems when the difference in consumption power between the modulation unit 70 and the demodulation unit 80 is great.

Figure 17:
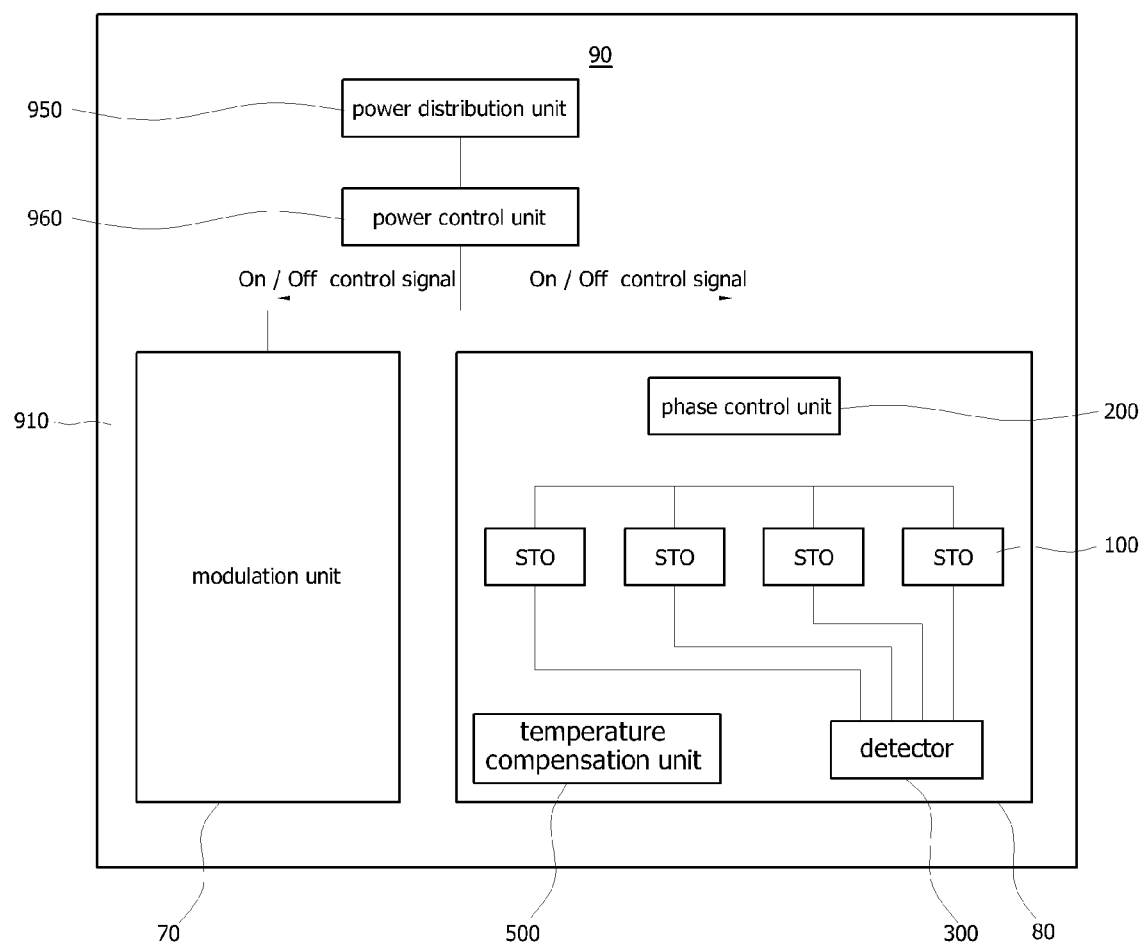
FIG. 17 is a diagram illustrating the third configuration of the modulation and demodulation integrated device according to the embodiment of the present invention.

Furthermore, referring to FIG. 17, the modulation and demodulation integrated device according to this embodiment of the present invention may further include a power control unit 960 configured to control the output channels of the power distribution unit 950. The power control unit 960 may selectively turn on and off the power of the modulation unit 70 or demodulation unit 80 by controlling the output channels of the power distribution unit 950.

That is, the power distribution unit 950 may generate power of levels appropriate for the modulation unit 70 and the demodulation unit 80 because the power specifications of the modulation unit 70 may be different from those of the demodulation unit 80, and supply the power to the power control unit 960. The power control unit 960 determines whether to supply powers and then supply the powers to the modulation unit 70 and the demodulation unit 80. As described above, the operation of the modulation unit 70 or the demodulation unit 80 is controlled by the power control unit 960, and the demodulation integrated device according to the present invention may be operated in a manner in which it is used exclusively for transmission, used exclusively for reception, and used for both transmission and reception.

Figure 18:
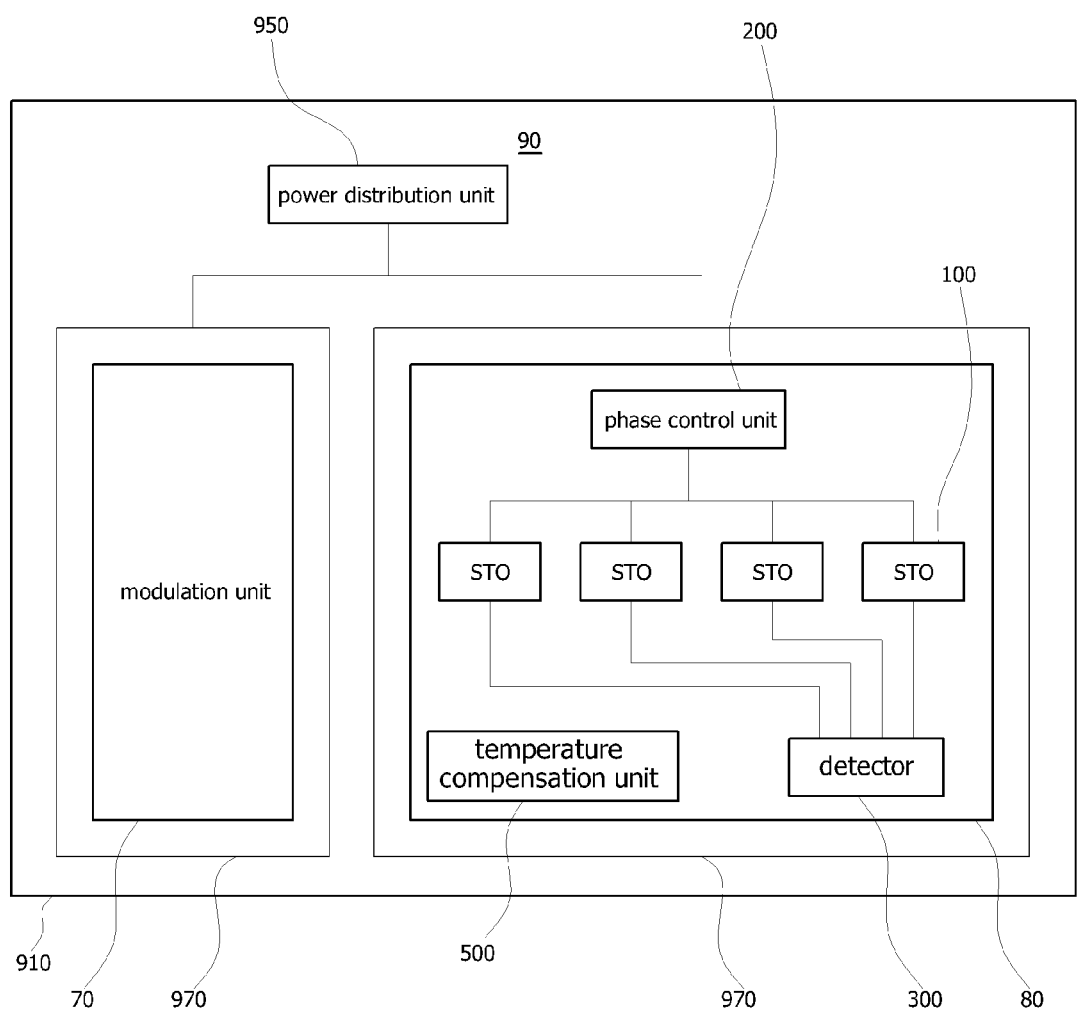
FIG. 18 is a diagram illustrating the fourth configuration of the modulation and demodulation integrated device according to the embodiment of the present invention.

Furthermore, referring to FIG. 18, the modulation and demodulation integrated device according to this embodiment of the present invention may further include a shield film 970 provided in at least any one of the modulation unit 70 and the demodulation unit 80. As described above, the shield film 970 is provided, thereby blocking radio waves generated by the modulation unit 70 and also preventing changes in the characteristics of electric signals flowing through the demodulation unit 80, which are attributable to surrounding temperature and surrounding magnetism.

If the shield film 970 is formed of a ferromagnetic material having high permeability, it can function to provide magnetic shielding. For example, if the shield film 970 is installed in close contact with the demodulation unit 80, the shield film 970 functions to block heat, and thus can prevent the characteristics of the demodulation unit 80 from being changed by a rise in temperature.

Although the demodulation device, and the demodulation integrated device and the modulation and demodulation integrated device using the same according to the present invention have been described with reference to the drawings, the present invention is not limited to the embodiments disclosed herein and the accompanying drawings, and it will be apparent to those skilled in the art that various modifications and variations may be made within the scope of the technical spirit of the present invention.

INDUSTRIAL APPLICABILITY

According to the present invention, an amplitude phase modulated signal or a frequency phase modulated signal can be demodulated using the phase locking characteristics of spin devices, and thus the present invention can be used effectively in the field of wireless communication.

The invention claimed is:
1. A demodulation device, comprising:
a spin device configured to output an oscillation signal;
a phase control unit configured to assign a predetermined phase locking characteristic to the spin device, thereby causing the oscillation signal to be tuned to a modulation signal that is input to the spin device; and
a detector configured to demodulate the oscillation signal that is output by the spin device and tuned to the modulation signal, thereby restoring information carried on the oscillation signal,
wherein the phase control unit comprises a current generation unit configured to assign a phase locking characteristic to the spin device by applying a predetermined current to the spin device; and
wherein the phase control unit further comprises a magnetic field generation unit configured to assign a phase locking characteristic to the spin device along with the current generation unit by applying a predetermined magnetic field to the spin device.

2. The demodulation device of claim 1, further comprising a magnetic field detection unit configured to detect the magnetic field applied by the magnetic field generation unit.

3. The demodulation device of claim 1, further comprising a temperature compensation unit configured to detect a temperature of the spin device and to compensate for changes in characteristic attributable to the detected temperature.

4. The demodulation device of claim 1, wherein the modulation signal is received from an antenna;
further comprising a first amplifier disposed between the antenna and the spin device and configured to amplify the modulation signal.

5. The demodulation device of claim 4, further comprising a second amplifier disposed behind the spin device and configured to amplify the oscillation signal.

6. The demodulation device of claim 1, wherein the spin device, if receiving a modulation signal having a frequency of $f_0$, recognizes the modulation signal as a 2nd harmonic signal and outputs a phase-locked signal having a frequency of $f_0/2$.

7. The demodulation device of claim 1, wherein:
the spin device comprises a plurality of spin devices configured to output respective phase-locked signals tuned to specific frequencies of input modulation signals;
the phase control unit comprises a plurality of phase control units corresponding to the plurality of spin devices, respectively; and
the phase control units cause oscillation signals output by the plurality of the spin devices to be tuned to modulation signals input to the plurality of spin devices.

8. The demodulation device of claim 7, wherein:
the detector comprises a plurality of detectors corresponding to the plurality of spin devices; and
the detectors restore information carried on the phase-locked signals by demodulating the phase-locked signals output by the plurality of spin devices.

9. The demodulation device of claim 8, wherein the modulation signals are received from an antenna;
further comprising a plurality of first amplifiers disposed between the antenna and the plurality of spin devices and configured to amplify the modulation signals; and
further comprising a plurality of second amplifiers disposed behind the plurality of spin devices and configured to amplify the phase-locked signals.

10. The demodulation device of claim 7, wherein each of the plurality of phase control units comprises:
a current generation unit configured to assign a phase locking characteristic to the corresponding spin device by applying a predetermined current to the corresponding spin device; and
a magnetic field generation unit configured to assign a phase locking characteristic to the corresponding spin device along with the current generation unit by applying a predetermined magnetic field to the corresponding spin device.

11. The demodulation device of claim 10, further comprising:
a plurality of magnetic field detection units configured to detect magnetic fields applied by the magnetic field generation units; and
a temperature compensation unit configured to detect temperatures of the plurality of spin devices and to compensate for changes in characteristic attributable to the detected temperatures.

12. A demodulation integrated device, comprising:
a substrate;
a plurality of spin devices configured to receive power from electrodes provided on the substrate, to be operated with the power, and to output oscillation signals;
a phase control unit configured to assign predetermined phase locking characteristics to the respective spin devices, thereby causing the oscillation signals to be tuned to modulation signals input to the respective spin devices;
a detector configured to restore information carried on the oscillation signals by demodulating the oscillation signals that are output by the respective spin devices and tuned to the modulation signals; and
a current distribution unit disposed between the electrodes and the plurality of magnetic field generation units and configured to distribute and supply currents to the respective magnetic field generation units so that the magnetic field generation units can generate respective magnetic fields,
wherein the phase control unit comprises a current generation unit disposed between the electrodes and the plurality of spin devices, to generate currents that assign predetermined phase locking characteristics to the respective spin devices, and to distribute the currents; and
wherein the phase control unit further comprises a plurality of magnetic field generation units disposed on the respective spin devices and configured to assign phase locking characteristics to the spin devices by applying predetermined magnetic fields to the spin devices.

13. The demodulation integrated device claim 12, further comprising a temperature compensation unit configured to detect temperatures of the plurality of spin devices and to compensate for changes in characteristic attributable to the detected temperatures.

14. A modulation and demodulation integrated device, comprising:
a substrate;
a modulation unit provided on the substrate and configured to transmit a modulation signal; and
a demodulation unit provided on the substrate and receive the modulation signal;
wherein the demodulation unit comprises:
a plurality of spin devices configured to output oscillation signals;
a phase control unit configured to assign predetermined phase locking characteristics to the respective spin devices, thereby causing the oscillation signals to be tuned to modulation signals that are input to the spin devices; and
a detector configured to demodulate the oscillation signals that are output by the respective spin devices and tuned to the modulation signals, thereby restoring information carried on the oscillation signals.

15. The modulation and demodulation integrated device of claim 14, further comprising a power distribution unit configured to distribute power to the modulation unit and the demodulation unit.

16. The modulation and demodulation integrated device of claim 15, further comprising a power control unit configured to selectively turn on and off at least any one of the modulation unit and the demodulation unit by controlling output channels of the power distribution unit.

17. The modulation and demodulation integrated device of claim 15, further comprising a shield film provided in at least any one of the modulation unit and the demodulation unit and configured to prevent characteristics of an electric signal flowing through the demodulation unit, from being changed by a surrounding environment.

18. The modulation and demodulation integrated device of claim 14, further comprising a temperature compensation unit configured to detect temperatures of the plurality of spin devices and to compensate for changes in characteristic attributable to the detected temperatures.

* * * * *